United States Patent [19]
Hayashi

[11] Patent Number: 5,200,714
[45] Date of Patent: Apr. 6, 1993

[54] CRYSTAL OSCILLATOR WITH QUARTZ VIBRATOR HAVING TEMPERATURE DETECTING FACULTY, QUARTZ VIBRATOR FOR USE THEREIN, AND METHOD OF MEASURING TEMPERATURE USING QUARTZ VIBRATOR

[75] Inventor: Hitoaki Hayashi, Tokyo, Japan
[73] Assignee: Asahi Dempa Co., Ltd., Tokyo, Japan
[21] Appl. No.: 725,486
[22] Filed: Jul. 3, 1991

[30] Foreign Application Priority Data
Jul. 7, 1990 [JP] Japan .................................. 2-178501

[51] Int. Cl.⁵ .......................... H03B 1/00; H03B 5/32; H03L 1/02; H01L 41/107
[52] U.S. Cl. ........................................ 331/66; 331/69; 331/158; 331/162; 331/163; 331/176; 310/315; 310/318; 310/342; 310/343; 310/344
[58] Field of Search ........ 331/66, 69, 116 R, 116 FE, 331/158, 162, 163, 176; 310/312, 315, 320, 341, 342, 343, 344, 346, 347, 365, 366, 318; 324/105; 73/DIG. 4

[56] References Cited

U.S. PATENT DOCUMENTS

| | | | |
|---|---|---|---|
| 3,826,931 | 7/1974 | Hammond | 331/163 X |
| 3,879,992 | 4/1975 | Bartera | 331/162 X |
| 4,719,384 | 1/1988 | Hauden et al. | 331/69 X |
| 4,760,351 | 7/1988 | Newell et al. | 331/162 X |
| 4,839,613 | 6/1989 | Echols et al. | 331/69 |
| 5,004,987 | 4/1991 | Hurley | 332/70 |

OTHER PUBLICATIONS

Schodowski, "Resonator Self-Temperature-Sensing Using a Dual-Harmonic-Mode Crystal Oscillator", 43rd Annual Symposium on Frequency Control, pp. 2-7, 1989.
Bloch, et al., "The Microcomputer Compensated Crystal Oscillator", 43rd Annual Symposium on Frequency Control, pp. 16-19, 1989.
Filler, et al., "Resonators for the Microcomputer Compensated Crystal Oscillator", 43rd Annual Symposium on Frequency Control, pp. 8-15, 1989.

Primary Examiner—David Mis
Attorney, Agent, or Firm—Stevens, Davis, Miller & Mosher

[57] ABSTRACT

A crystal oscillator for generating an output oscillation whose frequency is maintained constant independently of the variation of temperature including a first quartz vibrator arranged in a heating unit which includes a thermostat and vibrating at a fundamental frequency, a second quartz vibrator arranged also in the same heating unit and vibrating at a third overtone frequency, a frequency multiplying circuit for multiplying the fundamental frequency by three, a frequency comparator for comparing the fundamental frequency multiplied by three with the third overtone frequency to derive a frequency difference which represents a temperature of the thermostat, and a temperature controlling circuit for controlling the temperature setting of the thermostat in accordance with the detected frequency difference. Any one or both of the fundamental and third overtone oscillations may be derived as an output oscillation. The first and second quartz vibrators are constructed by a single common quartz substrate, a first pair of electrodes each applied on respective main surfaces of the quartz substrate, and a second pair of electrodes each applied on respective main surfaces of the quartz substrate.

18 Claims, 4 Drawing Sheets

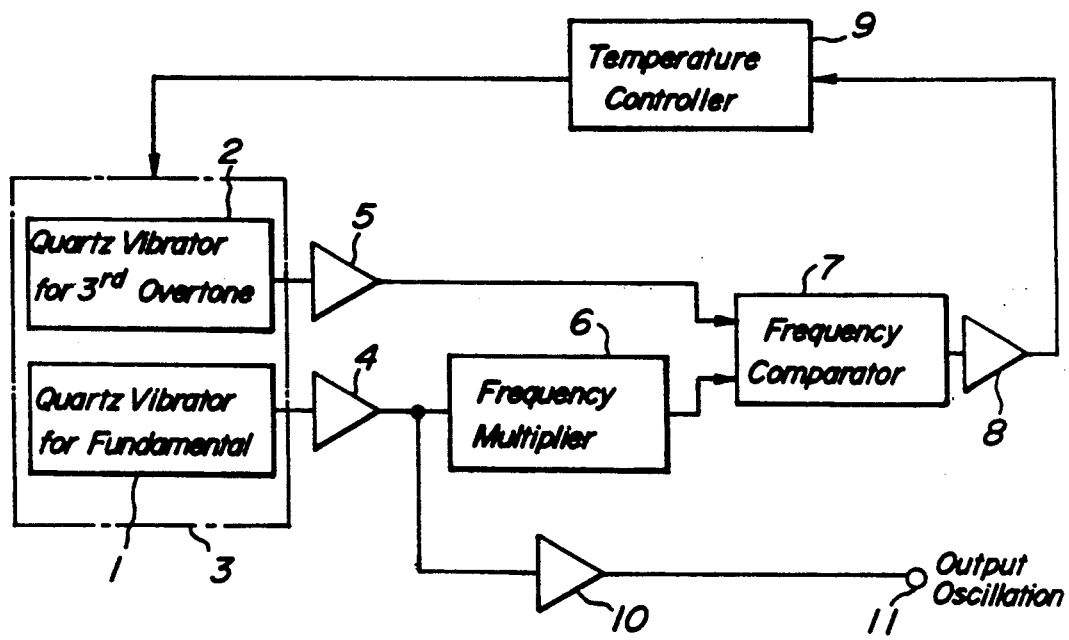
FIG_1
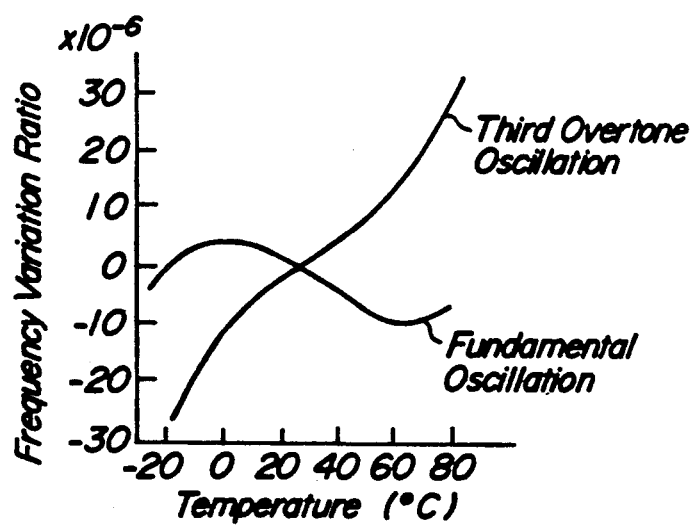
FIG_2

FIG_3
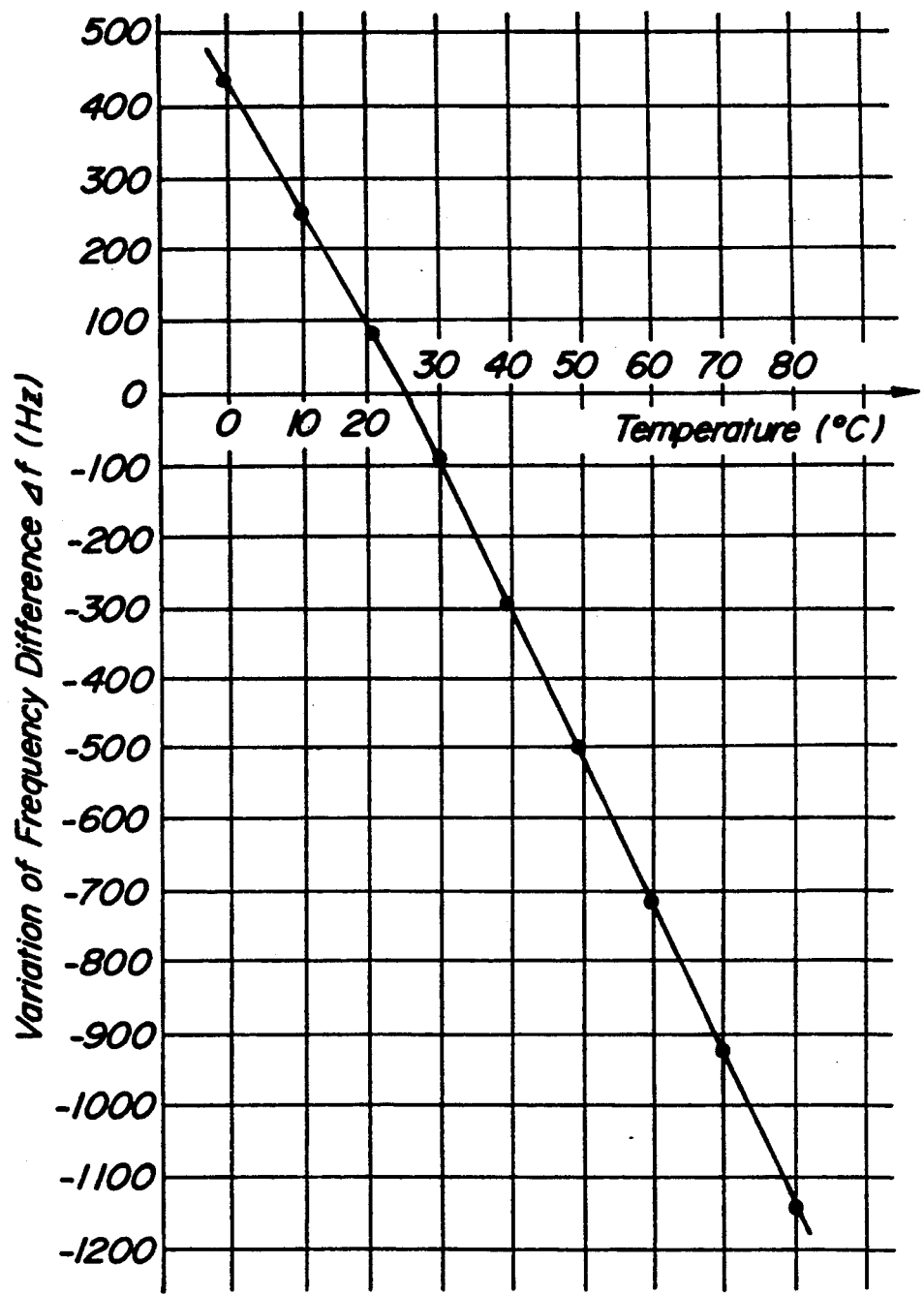

FIG_4
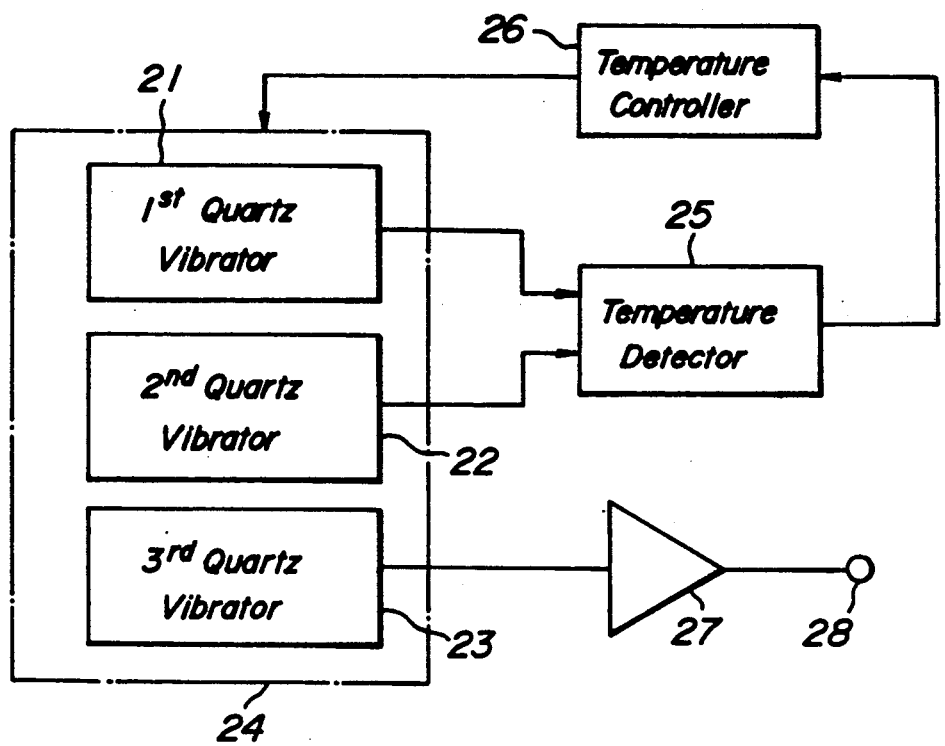
FIG_5
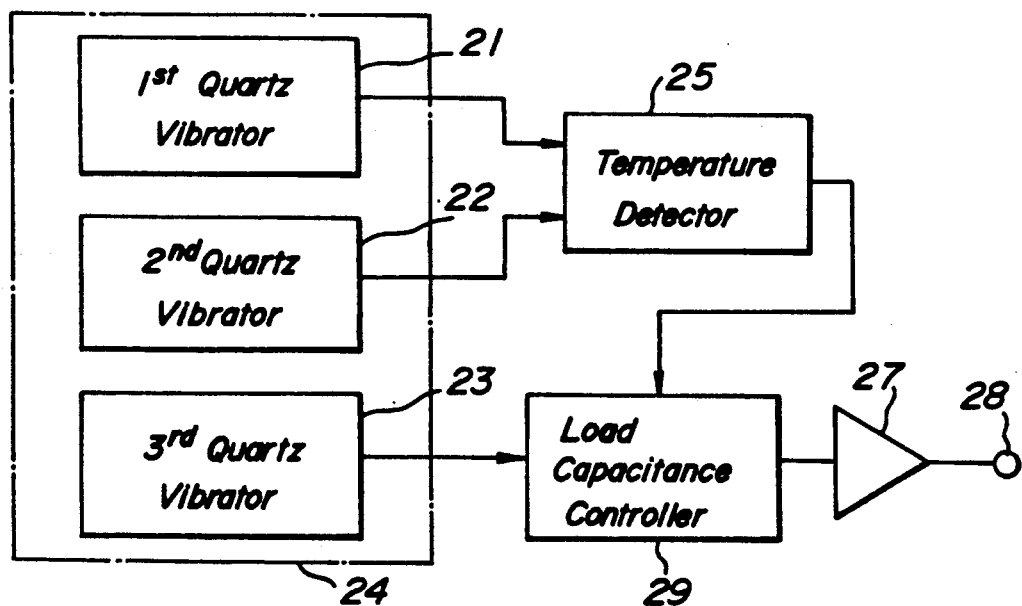

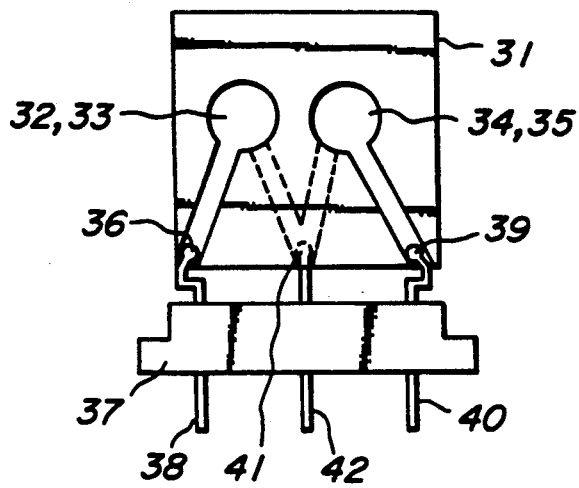
FIG_6
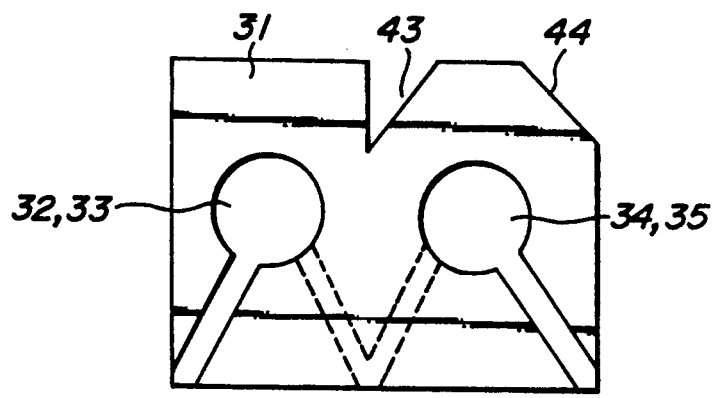
FIG_7
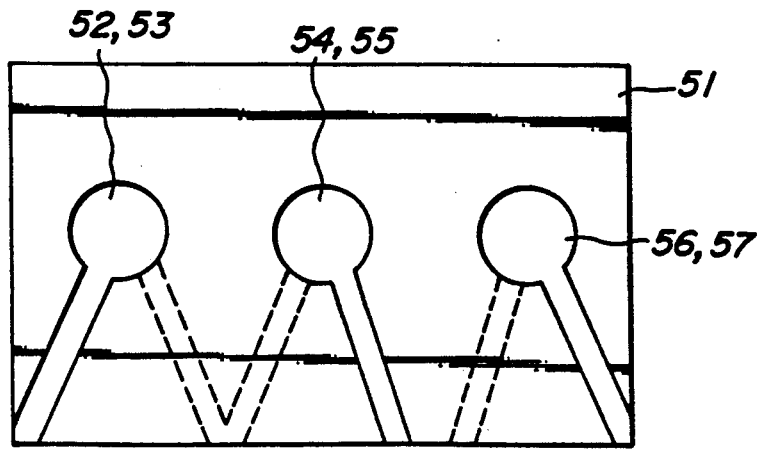
FIG_8

CRYSTAL OSCILLATOR WITH QUARTZ VIBRATOR HAVING TEMPERATURE DETECTING FACULTY, QUARTZ VIBRATOR FOR USE THEREIN, AND METHOD OF MEASURING TEMPERATURE USING QUARTZ VIBRATOR

BACKGROUND OF THE INVENTION

Field of the Invention and Related Art Statement

The present invention relates to an oscillator having a temperature detecting faculty and a quartz vibrator for use in such an oscillator. The invention also relates to a method of measuring a temperature by using a quartz vibrator having the temperature sensing faculty.

There have been generally proposed the following two methods for stabilizing an oscillation frequency of a crystal oscillator. In a first method, the temperature of the quartz vibrator is maintained to be constant during the operation. A crystal oscillator whose frequency is stabilized by such a method is usually called a temperature controlled crystal oscillator. In a second temperature compensating method, the temperature of the atmosphere surrounding the quartz vibrator is detected and a load capacitance of the quartz vibrator is changed in accordance with the detected temperature of the ambient atmosphere. A crystal oscillator whose oscillation frequency is compensated for by the second method is generally called a temperature compensated crystal oscillator.

In the former temperature controlled crystal oscillator, the quartz vibrator is placed in a source of heating and cooling which is controlled by a thermostat and is kept at a desired temperature. When a cutting angle of quartz is suitably selected, the temperature characteristic of the oscillation frequency of the quartz vibrator becomes substantially flat in a temperature range of 60° to 70° C., so that the operating temperature of the quartz vibrator is usually set at a temperature within said range. Since the operating temperature is higher than the room temperature, the thermostat usually comprises a heater, but does not include a cooling device or element. That is to say, the temperature of the thermostat is measured by a thermistor and the heater is selectively operated in accordance with a deviation of the thermostat temperature from a standard temperature. In the temperature compensated crystal oscillator, the ambient temperature is measured by a temperature detecting element such as the thermistor and the load capacitance of the oscillator is controlled in accordance with a deviation of the detected temperature from a standard temperature.

In the known temperature controlled crystal oscillator mentioned above, the thermistor is used as the temperature detecting element. However, the material, shape and size of the thermistor are entirely different from those of the quartz vibrator, so that the temperature variation of the thermistor does not accurately reflect the temperature variation of the quartz vibrator. Therefore, it is very difficult to maintain the temperature of the quartz vibrator at the desired constant temperature. In other words, although the temperature of the thermostat is controlled on the basis of the detected temperature, the quartz vibrator is not kept at the desired temperature, so that the oscillation frequency deviates from a desired frequency. In order to avoid the above mentioned drawback, the construction and mutual position of the quartz vibrator and thermistor have to be changed. But in practice, it is rather difficult to attain the optimum design, and thus the oscillation frequency of the quartz vibrator could not be maintained at the desired frequency in an accurate and reliable manner.

In the temperature compensated crystal oscillator, the thermistor is also used for measuring the ambient temperature, so that the above explained drawback could not be avoided.

It has been known that a specially cut quartz vibrator has the temperature characteristic in which the oscillation frequency is varied at a rate of several ppm per a unit temperature variation of 1° C. Then it has been proposed to detect the temperature of the quartz vibrator by measuring the temperature of the quartz vibrator and the oscillation frequency is controlled in accordance with the detected temperature. However, since the frequency variation is very small, it is practically impossible to detect it precisely. Due to this, this compensating method has not been actually used.

SUMMARY OF THE INVENTION

The present invention has for its object to provide a novel and useful crystal oscillator whose oscillation frequency can be precisely maintained at a desired frequency.

According to the invention, a crystal oscillator with the temperature detecting faculty comprises:

an oscillating means including at least one quartz vibrator for generating at least a fundamental oscillation and an n-th overtone oscillation, a temperature-frequency characteristic of the oscillating means for the fundamental oscillation being different from that for the n-th overtone oscillation;

a temperature detecting means for receiving the fundamental oscillation and n-th overtone oscillation generated by said oscillating means and processing frequencies of these oscillations to detect a temperature of the quartz vibrator;

an output means for generating at least one oscillation generated by said oscillating means as an output oscillation.

It is another object of the present invention to provide a novel quartz vibrator which has a faculty for detecting a temperature thereof.

According to the invention, a quartz vibrator comprises:

a quartz substrate having opposing main surfaces;

a first pair of electrodes each being applied on respective main surfaces of the quartz substrate at a first portion which vibrates at a fundamental frequency; and a second pair of electrodes each being applied on respective main surfaces of the quartz substrate at a second portion which vibrates at an n-th overtone frequency.

It is still another object of the invention to provide a method of measuring a temperature of an atmosphere comprises the steps of:

placing at least one quartz vibrator in an atmosphere whose temperature is to be detected;

operating said at least one quartz vibrator such that the quartz vibrator generates a fundamental oscillation and an n-th overtone oscillation whose temperature characteristic is different from that of the fundamental oscillation;

multiplying a frequency of said fundamental oscillation by n or dividing a frequency of said n-th overtone oscillation by n to derive a modified frequency; and detecting a difference between said modified frequency and the frequency of said fundamental oscillation or n-th overtone oscillation to detect a temperature of the atmosphere.

The present invention is based on the recognition of the fact that the temperature characteristic of the fundamental oscillation is largely different from that of the n-th overtone oscillation, and thus the difference between the fundamental frequency and the n-th overtone frequency is varied relatively largely in accordance with the temperature variation of the atmosphere in which the quartz vibrator is placed, so that the temperature of the atmosphere can be measured precisely by detecting the frequency difference.

In a preferred embodiment of the crystal oscillator according to the invention, first and second quartz vibrators are operated in the same atmosphere and are vibrated at the fundamental frequency and third overtone frequency, respectively. Then, the fundamental frequency is multiplied by three and the frequency difference between the thus multiplied frequency and the third overtone frequency is derived. The temperature of the atmosphere is detected in accordance with the thus derived frequency difference. By controlling the temperature of the atmosphere in accordance with the detected frequency difference such that the frequency difference becomes minimum or a predetermined off-set value, the oscillation frequencies of the first and second quartz vibrators can be kept at desired frequencies in a positive and reliable manner. In this case, any one or both of the fundamental wave and the third overtone wave may be derived as the output oscillation.

According to the invention, the first and second quartz vibrators may be placed in the same thermostatted heater and the temperature setting of the thermostat may be controlled in accordance with the frequency difference. Alternately, the load capacitances of the first and second quartz vibrators may be controlled in accordance with the detected frequency difference. Furthermore, it is preferable to set the frequency difference at the standard temperature not to zero, but to a value within a range from several KHz to several hundred KHz. Then, the signal processing can be performed easily and precisely.

In another preferable embodiment of the quartz vibrator according to the invention, two or three pairs of electrodes are provided on a single quartz substrate such that a portion of the quartz substrate can vibrate at the fundamental tone and one or more further portions of the quartz substrate can vibrate at one or more overtone frequencies. Then, the frequency difference is derived in the same manner as that of the above mentioned embodiment, and the temperature of the thermostat or the load capacitance is controlled in accordance with the detected frequency difference. When three pairs of electrodes are provided on the quartz substrate, the third pair of electrodes may be used to generate the output oscillation signal.

BRIEF DESCRIPTION OF THE DRAWINGS

FIG. 1 is a block diagram showing the construction of an embodiment of the crystal oscillator according to the invention;

FIG. 2 is graph representing the temperature characteristic of the fundamental tone and overtone frequencies;

FIG. 3 is a graph depicting the temperature variation of the frequency difference between three times of the fundamental tone frequency and the third overtone frequency;

FIG. 4 is a block diagram illustrating the construction of the second embodiment of the crystal oscillator according to the invention;

FIG. 5 is a block diagram showing the construction of a third embodiment of the crystal oscillator according to the invention;

FIG. 6 is a plan view illustrating the construction of a first embodiment of the quartz vibrator according to the invention;

FIG. 7 is a plan view showing the construction of a second embodiment of the quartz vibrator according to the invention; and FIG. 8 is a plan view depicting the construction of a third embodiment of the quartz vibrator according to the invention.

DESCRIPTION OF THE PREFERRED EMBODIMENTS

FIG. 1 is a block diagram showing the whole construction of a first embodiment of the crystal oscillator according to the invention. A first quartz vibrator 1 which vibrates at a fundamental tone frequency and a second quartz vibrator 2 which vibrates at third overtone frequency are placed in the same regulated heating unit which includes a thermostat 3. Fundamental tone generated from the first quartz vibrator 1 and third overtone generated by the second quartz vibrator 2 are amplified by pre-amplifiers 4 and 5, respectively. The frequency of the fundamental tone is then multiplied by three by means of a frequency multiplying circuit 6. The output signal of the frequency multiplying circuit 6 and the output signal of the pre-amplifier 5 are then supplied to a frequency comparator circuit 7 and a frequency difference between these output signals is derived. The frequency difference signal supplied from the frequency comparator circuit 7 is amplified by an amplifier 8 and then is supplied to a temperature control circuit 9. According to the invention, the frequency difference represents the temperature of the first and second quartz vibrators 1 and 2, and thus in the temperature control circuit 9, the temperature of the quartz vibrators is detected and the thus detected temperature is compared with a previously determined standard temperature to derive a temperature difference. Then, the temperature control circuit 9 controls the temperature setting of the thermostat 3 in accordance with the detected temperature difference such that the temperature difference becomes minimum. In this manner, the temperature of the first and second quartz vibrators 1 and 2 can be maintained at the standard temperature, and therefore the frequency of the fundamental tone can be kept at a desired frequency. The fundamental tone produced by the pre-amplifier 4 is supplied to an output terminal 11 via an amplifier 10.

The temperature characteristic of the quartz vibrator is dependent upon various factors such as the cutting angle of the quartz plate, vibration mode, the order of the oscillation and load capacitance, so that when these factors are determined, the temperature characteristic can be determined predominantly. For instance, temperature characteristics for the fundamental tone and third overtone of the AT cut quartz vibrator which vibrates in the thickness shear mode are represented by curve shown in FIG. 2. FIG. 2 shows a variation ratio of a difference of a frequency f at a varying temperature from a standard frequency $f_0$ at 25° C., i.e. $f-f_0/f_0$.

The frequency variation ratio of the fundamental tone is about 0.5 ppm for a unit temperature variation of 1° C., and that of the third overtone is at most the order of 1 ppm. Therefore, it is practically impossible to measure the temperature of the quartz vibrator by detecting the very small variation of the oscillation frequency. For example, when it is assumed that the frequency variation ratio is 1 ppm and the fundamental frequency is 10 MHz, it is necessary to detect the frequency variation of 1 Hz for a temperature variation of 0.1° C. It is practically impossible to detect such a small frequency variation at a high precision.

According to the present invention, the fact that the frequency variation ratio of the fundamental tone differs greatly from that of the third overtone has been recognized, so that by detecting the frequency difference between three times of the fundamental frequency and the third overtone frequency it is possible to measure the temperature of the quartz vibrators 1 and 2 at a very high sensitivity and accuracy. For instance, it is assumed that the standard temperature is 25° C., the frequency difference can be made zero. In this case, the quartz vibrator may be vibrated selectively at the fundamental frequency and third overtone frequency by changing an oscillation circuit connected to the quartz vibrator. As described in U.S. Pat. No. 4,716,332, the same quartz vibrator may be vibrated at the fundamental frequency or third overtone frequency by cutting the quartz plate.

Theoretically, the difference between three times the fundamental frequency and the third overtone frequency may be zero at the standard temperature, but then the frequency difference is liable to be very low, so that the processings of the frequency difference such as amplifying, frequency multiplying and A/D conversion could not be performed easily and the frequency difference could not be detected accurately. In general, the frequency suitable for signal processing is about several KHz to several hundred KHz. That is to say, when the frequency difference at the standard temperature is set within this range, it can be processed easily and the frequency difference can be detected precisely. This can be performed by slightly changing the thickness of the quartz plate and the thickness of the electrodes applied on the quartz plate.

In the above mentioned embodiment of the crystal oscillator according to the invention, each of the first and second quartz vibrators 1 and 2 is formed by an AT cut quartz plate having a cut angle with respect to Y axis of 35°14', a thickness of 0.16 mm, the fundamental frequency of 10 MHz, and the frequency difference $\Delta F$ of about 20 KHz at the standard temperature. Then the frequency variation ratio $\Delta f$ between third times of the fundamental frequency at the standard temperature of 25° C. is shown in the following table.

TABLE 1

| Temperature °C. | Frequency deviation of 3 × fundamental frequency (Hz) | Frequency deviation of third overtone frequency (Hz) | Δf (calculated) | Δf (measured) |
|---|---|---|---|---|
| 0 | 54 | −384 | 438 | 439 |
| 10 | 48 | −216 | 258 | 259 |
| 20 | 17 | −66 | 83 | 84 |
| 25 | 0 | 0 | 0 | 0 |
|  | (29,999,687 Hz) | (29,975,070 Hz) | (24,617 Hz) | (24,616 Hz) |
| 30 | −14 | 76 | −90 | −91 |
| 40 | −56 | 226 | −282 | −285 |
| 50 | −82 | 411 | −493 | −494 |
| 60 | −70 | 632 | −702 | −702 |

TABLE 1-continued

| Temperature °C. | Frequency deviation of 3 × fundamental frequency (Hz) | Frequency deviation of third overtone frequency (Hz) | Δf (calculated) | Δf (measured) |
|---|---|---|---|---|
| 70 | +2 | 921 | −919 | −917 |
| 80 | +160 | 1295 | −1135 | −1132 |

In the table 1, $\Delta f$(calculated) means the frequency difference calculated by subtracting $\Delta F$ at the standard temperature from the difference between the frequency of the fundamental oscillation and that of the third overtone oscillation, and $\Delta f$(measured) represents the frequency difference actually measured by the frequency difference detecting circuit 7. In the present embodiment, the frequency difference between three times of the fundamental frequency and the third overtone frequency at the standard temperature of 25° C. becomes 21,616 Hz which is close to the desired frequency difference of 20 KHz. Further the measured frequency difference $\Delta f$(measured) is quite similar to the calculated frequency difference $\Delta f$(calculated). Moreover, as illustrated in FIG. 3, the frequency variation ratio in a temperature range lower than 25° C. is 17.6 Hz/° C. and the frequency variation ratio in a temperature range higher than 25° C. is 20.6 Hz/° C., these frequency variation ratios amount to 700 to 800 ppm.

As explained above, in the present embodiment, the first and second quartz vibrators 1 and 2 are constructed such that the difference between three times the frequency of the fundamental oscillation generated by the first quartz vibrator 1 at the standard temperature of 25° C. and the frequency of the third overtone oscillation generated by the second quartz vibrator 2 at the standard temperature becomes about 20 KHz, and the temperature of these quartz vibrators is controlled in accordance with the frequency difference such that the fundamental frequency is stabilized at the desired frequency in an accurate and precise manner.

In the first embodiment so far explained, the fundamental frequency is multiplied by three and is compared with the third overtone frequency. According to the invention it is also possible to divide the third overtone frequency by three and the thus divided frequency may be compared with the fundamental frequency. Such a frequency division has been well known in the art, so that its detailed explanation is dispensed with.

The frequency variation $\Delta f$ becomes substantially constant independently of the value of the frequency difference $\Delta F$. Therefore, if $\Delta F$ is set to 1 KHz, the temperature coefficient of the frequency variation $\Delta f$ becomes large (e.g. 10,000 ppm). However, in such a case, the frequency difference $\Delta F$ at 60° C. becomes $1,000 - 701 \approx 300$ Hz and thus the signal processing could not be performed easily. Moreover, if the frequency difference $\Delta F$ at the standard temperature is set to 1 MHz, the temperature coefficient of the frequency variation becomes very small (e.g. 10 ppm) and the measuring precision is lowered.

FIG. 4 is a block diagram showing a second embodiment of the crystal oscillator according to the invention. In this embodiment, three quartz vibrators 21, 22 and 23 are arranged in the same thermostat 24 such that these vibrators have the same temperature. The first quartz vibrator 21 is operated at the fundamental frequency and the second quartz vibrator 22 is oscillated at the third overtone frequency. The fundamental oscillation and third overtone oscillation generated by the first and second quartz vibrators 21 and 22 are supplied to a temperature detecting circuit 25 in which the temperature of these quartz vibrators is detected in the manner explained above in the first embodiment. Then, the temperature setting of the thermostat 24 is controlled by a temperature controlling circuit 26 in accordance with the detected temperature. In this manner, the third quartz vibrator 23 can be kept always at a desired temperature and an oscillation generated by this third quartz vibrator is supplied via an amplifier 27 to an output terminal 28. In the second embodiment, the frequency of the output signal appearing at the output terminal 28 may be set at will independently of the frequencies of the first and second quartz vibrators 21 and 22.

FIG. 5 is a block diagram illustrating a third embodiment of the crystal oscillator according to the invention. In the present embodiment, the temperature of the first, second and third quartz vibrators 21, 22 and 23 which are arranged in the same thermostat 24 is detected by supplying the oscillations generated by the first and second quartz vibrators to a temperature detecting circuit 25. Then the load capacitance is controlled in the load capacitance controlling circuit 29 in accordance with the detected temperature such that the frequency of the output oscillation appearing at the output terminal 28 can be maintained constant even if the temperature of the quartz vibrator 23 is changed.

FIG. 6 is a front view depicting a first embodiment of the quartz vibrator according to the invention. In the present embodiment, on opposing main surfaces of a quartz substrate 31 are applied two sets of electrodes. That is to say, one electrode 32 of the first set is provided on one main surface and the other electrode 33 is formed on the other main surface, and one electrode 34 of the second electrode set is applied on one main surface and the other electrode 35 is provided on the other main surface. The first electrode set 32, 33 serves to vibrate at the fundamental frequency and the second electrode set 34, 35 operates to vibrate at the third overtone frequency. The electrodes 32 and 34 provided on the one main surface of the quartz substrate 31 are connected to pins 38 and 40, respectively via lead wires 36 and 39 and the electrodes 33 and 35 arranged on the other main surface are connected together and are further connected to a pin 42 via a lead wire 41. In order to operate the single quartz substrate 31 at two different frequencies, the size of the electrodes may made sufficiently small with respect to the size of the quartz substrate or a groove may be formed in the quartz substrate between two sets of electrodes by mechanical working or chemical etching.

FIG. 7 is a front view showing a second embodiment of the crystal vibrator according to the invention. In this embodiment, a part of the quartz substrate 31 which vibrates at the third overtone frequency is cut to form triangular notches 43 and 44 as disclosed in the above mentioned U.S. Pat. No. 4,716,332. It should be noted that the quartz substrate 31 may be vibrated at different frequencies by differing the frequency selecting properties of oscillation circuits connected to the electrode sets.

When the crystal oscillator is constructed by using the quartz vibrators shown in FIGS. 4 and 5, the frequency difference between three times the fundamental frequency and the third overtone frequency or between the fundamental frequency and a third of the third overtone frequency is determined and the thermostat or load capacitance is controlled in accordance with the thus detected frequency difference. In this case, the fundamental signal or third overtone signal or both of them may be supplied as the output signal or signals of the crystal oscillator. Moreover, the temperature of the ambient atmosphere surrounding the quartz vibrator may be detected in the manner explained above.

FIG. 8 is a front view depicting a third embodiment of the quartz vibrator according to the invention. In the present embodiment, on opposing main surfaces of a single quartz substrate 51 there are provided three sets of electrodes 52, 53; 54, 55; 56, 57. The first electrode set 52, 53 function to vibrate at the fundamental frequency, the second electrode set 54, 55 serve to vibrate at the third overtone frequency, and the third electrode set 56, 57 operates to vibrate at a desired frequency. As illustrated in FIG. 4, the oscillations of the fundamental frequency and third overtone frequency are used to detect the temperature of the quartz vibrator, and the thermostat setting is controlled in accordance with the thus detected temperature. The oscillation generated by the third electrode set is supplied to the utilizing apparatus as the output signal. It should be noted that the load capacitance for the oscillation generated by the third electrode set may be controlled in accordance with the detected temperature as illustrated in FIG. 5.

The present invention is not limited to the embodiments so far explained, but many modifications and alternatives may be conceived by those skilled in the art within the scope of the invention. For instance, in the above embodiments, the quartz vibrator is placed in the thermostat and the temperature of the thermostat is controlled in accordance with the detected temperature. Usually the operating temperature of the quartz vibrator is set to 60° to 70° C. which is sufficiently higher than the room temperature, so that no cooling element need be provided. In such a case, a nichrome wire heater may be provided on the quartz substrate by the evaporation and a current passing through the heater may be adjusted in accordance with the detected temperature. In this manner, it is possible to obtain the quartz vibrator having the temperature detecting faculty as well as the temperature adjusting faculty.

As explained above in detail, according to the present invention, the temperature of the quartz vibrator can be detected by utilizing the difference in the temperature characteristic of the frequency for the fundamental oscillation and n-th overtone oscillation, so that it is no longer necessary to provide any additional temperature detecting element. Therefore, the temperature of the quartz vibrator can be detected very accurately and precisely without being affected by the difference in the thermal delay and capacitance between the quartz vibrator and the temperature detecting element. Further the temperature dependence the frequency difference is very large, so that the temperature can be detected at a very high sensitivity. Moreover, in the embodiment in which a plurality of electrode sets are provided on the single quartz substrate, the whole construction can be made very simple and the portions of the quartz substrate which vibrate at different frequencies can be maintained at the same temperature precisely. Further, when the frequency difference at the standard temperature is set to several KHz to several hundred KHz, the signal can be processed easily, and the temperature of the quartz vibrator can be detected very precisely.

What is claimed is:

1. A crystal oscillator with a temperature detecting faculty comprising:
   an oscillating means including at least a first quartz vibrator for generating a fundamental oscillation and a second quartz vibrator for generating an n-th overtone oscillation relative to said fundamental oscillation, a temperature-frequency characteristic of the first quartz vibrator being different from that for the second quartz vibrator;
   a temperature detecting means for receiving the fundamental oscillation and n-th overtone oscillation generated by said oscillating means and processing frequencies of these oscillations to detect a temperature of the first quartz vibrator and the second quartz vibrator; and
   an output means for outputting at least one oscillation generated by said oscillating means as an output oscillation.

2. A crystal oscillator according to claim 1, further comprising a controlling means for controlling the frequencies of said fundamental oscillation and said n-th overtone oscillation in accordance with said temperature detected by said temperature detecting means.

3. A crystal oscillator according to claim 2, wherein said controlling means comprises a heating unit which includes a thermostat and in which said first quartz vibrator and said second quartz vibrator are placed and a temperature controlling circuit for controlling the temperature setting of said thermostat in accordance with said temperature detected by said temperature detecting means.

4. A crystal oscillator according to claim 2, wherein said oscillating means further comprises a third quartz vibrator and said controlling means comprises a load capacitance controlling circuit which operates to change a load capacitance of said third quartz vibrator in accordance with the temperature of said third quartz vibrator.

5. A crystal oscillator according to claim 1, wherein said n-th overtone oscillation is a third overtone oscillation, and said temperature detecting means comprises a frequency calculating circuit for multiplying the frequency of the fundamental oscillation by three and a frequency comparator for comparing the frequency of the fundamental oscillation multiplied by three and the frequency of the third overtone oscillation with each other to detect said temperature.

6. A crystal oscillator according to claim 5, further comprising a heating unit which includes a thermostat and in which said first and second quartz vibrators are arranged.

7. A crystal oscillator according to claim 6, wherein said oscillating means further comprises a third quartz vibrator generating said output oscillation, said third quartz vibrator being arranged in said heating unit.

8. A crystal oscillator according to claim 6, wherein said first and second quartz vibrators comprise a common quartz substrate having opposing main surfaces, a first pair of electrodes each being applied on respective main surfaces of the quartz substrate at a first portion which vibrates at the fundamental frequency, and a second pair of electrodes each being applied on the respective main surfaces of the quartz substrate at a second portion which vibrates at the third overtone frequency.

9. A crystal oscillator according to claim 8, wherein said quartz substrate has cut out portions at said second portion of the quartz substrate.

10. A crystal oscillator according to claim 7, wherein said first, second and third quartz vibrators comprise a common quartz substrate having opposing main surfaces, a first pair of electrodes each being applied on respective main surfaces of the quartz substrate at a first portion which vibrates at the fundamental frequency, a second pair of electrodes each being applied on respective main surfaces of the quartz substrate at a second portion which vibrates at the third overtone frequency, and a third pair of electrodes each being applied on respective main surfaces of the quartz substrate at a third portion which vibrates at a frequency of said output oscillation.

11. A crystal oscillator according to claim 1, wherein said oscillating means is constructed to generate the fundamental oscillation and a third overtone oscillation, and said temperature detecting means comprises a frequency calculating circuit for dividing the frequency of the third overtone oscillation by three and a frequency comparator for comparing the frequency of the third overtone divided by three and the frequency of the fundamental oscillation with each other to detect the temperature of the oscillating means.

12. A quartz vibrator with a temperature detecting faculty, comprising:
   a quartz substrate having opposing main surfaces;
   a first pair of electrodes each being applied on respective main surfaces of the quartz substrate at a first portion which vibrates at a fundamental frequency; and
   a second pair of electrodes each being applied on respective main surfaces of the quartz substrate at a second portion which vibrates at an n-th overtone frequency relative to said fundamental frequency.

13. A quartz vibrator according to claim 12, wherein said n-th overtone frequency is a third overtone frequency.

14. A quartz vibrator according to claim 12, further comprising a third pair of electrodes each being provided on respective main surfaces of the quartz substrate at a third portion which vibrates at a predetermined frequency which is different from both the fundamental frequency and n-th overtone frequency.

15. A method of detecting a temperature by using a quartz vibrator, comprising the steps of:
   placing at least a first quartz vibrator and a second quartz vibrator in an atmosphere whose temperature is to be detected;
   operating said first quartz vibrator to generate a fundamental oscillation and said second quartz vibrator to generate an n-th overtone oscillation relative to said fundamental oscillation, a temperature characteristic of said first quartz vibrator being different from that of the second quartz vibrator;
   multiplying a frequency of said fundamental oscillation by n to derive a modified frequency; and
   detecting a different between said modified frequency and the n-th overtone oscillation to detect a temperature of the atmosphere.

16. A method according to claim 15, wherein said n-th overtone oscillation comprises a third overtone frequency.

17. A method according to claim 15, wherein said n-th overtone oscillation comprises a third overtone frequency, while said first and second quartz vibrators are both placed in a same heating unit which includes a thermostat.

18. A method of detecting a temperature by using a quartz vibrator, comprising the steps of:

placing a first quartz vibrator and a second quartz vibrator in an atmosphere whose temperature is to be detected;

operating said first quartz vibrator to generate a fundamental oscillation and said second quartz vibrator to generate an n-th overtone oscillation relative to said fundamental oscillation, a temperature characteristic of said first quartz vibrator being different from that of the second quartz vibrator;

dividing a frequency of said n-th overtone oscillation by n to derive a modified frequency; and detecting a difference between said modified frequency and the frequency of said fundamental oscillation to detect a temperature of the atmosphere.

* * * * *